United States Patent [19]

Heiss, Jr. et al.

[11] 4,059,708

[45] Nov. 22, 1977

[54] METHOD FOR SELECTIVE ENCAPSULATION

[75] Inventors: John Herbert Heiss, Jr., Bethlehem, Pa.; Joel Mark Schoen, Freehold, N.J.

[73] Assignee: Bell Telephone Laboratories, Incorporated, Murray Hill, N.J.

[21] Appl. No.: 710,010

[22] Filed: July 30, 1976

[51] Int. Cl.² .............................................. B05D 1/32
[52] U.S. Cl. ..................................... 427/96; 427/259; 427/273
[58] Field of Search ................... 357/72; 427/259, 96, 427/273

[56] References Cited

U.S. PATENT DOCUMENTS

| | | | |
|---|---|---|---|
| 3,343,048 | 9/1967 | Kuehn | 357/72 |
| 3,597,269 | 8/1971 | Chang | 357/72 |
| 3,928,661 | 12/1975 | Higbee | 427/259 |
| 3,935,334 | 1/1976 | Narui | 427/259 |

*Primary Examiner*—Ralph S. Kendall
*Attorney, Agent, or Firm*—Lester H. Birnbaum

[57] ABSTRACT

Disclosed is a method for encapsulating selected areas of solid state integrated circuits. The areas which are to remain uncoated are covered with a water and/or alcohol soluble polymer of sufficient viscosity to form stable droplets. The encapsulant is then applied, usually by flow coating, and cured. The polymer mask is removed by applying a material such as water or alcohol which does not affect the encapsulant. The method thus allows relatively small areas to be masked without any significant residue left on the circuit.

5 Claims, 5 Drawing Figures

METHOD FOR SELECTIVE ENCAPSULATION

BACKGROUND OF THE INVENTION

This invention relates to a method of fabricating solid state integrated circuits and, in particular, to a method of encapsulating selected areas of the circuits.

As is well known in the art of microelectronic circuit fabrication, an important step in the processing is to protect the components from the atmosphere by applying a suitable layer of encapsulating material. This material is often a silicone rubber dissolved in an organic solvent, and is formed over the entire circuit by a flow coating technique. In many instances in the production of thick film, thin film, and hybrid integrated circuits, it is desirable to leave certain portions of the circuit unencapsulated. For example, it is often desirable to test portions of the circuit after the encapsulant is applied, since the encapsulant will have some effect on the capacitances in the circuit. For the same reason, it is also desirable to leave certain resistors or capacitors unencapsulated so they can be trimmed subsequent to encapsulation of other elements in the circuit. In addition, it may be preferable in the manufacture of bi-level circuits to prevent the encapsulant from running into the via holes which are utilized for electrical connection between elements on both sides of the substrate.

At the present time, selective encapsulation can be performed by employing special fixtures such as rubber masks which are clamped down on the substrate, or by constructing dams to prevent the flow of encapsulant to the areas to be unencapsulated. The former method requires special fixtures for each substrate and can cause damage to circuit components, and the latter provides limited resolution, especially when used with flow coating encapsulation.

It is, therefore, a primary object of the invention to provide a method for selective encapsulation which does not require special fixtures and which provides good resolution with flow coating encapsulations.

SUMMARY OF THE INVENTION

This and other objects are achieved in accordance with the invention. The areas of the circuit which are to remain uncoated are masked with a material comprising a water and/or alcohol soluble polymer which is insoluble in organic solvents utilized in encapsulating material and which is sufficiently viscous to be deposited in the form of stable droplets. The encapsulant is then applied and cured without forming on the masked areas. The mask is then removed by dissolution in a solvent such as water or alcohol which leaves the encapsulant unaffected in the unmasked areas of the circuit.

BRIEF DESCRIPTION OF THE DRAWING

These and other features of the invention are delineated in detail in the description to follow. In the drawing.

It should be appreciated that for purposes of illustration these figures are not drawn to scale.

DETAILED DESCRIPTION OF THE INVENTION

Figure 1:
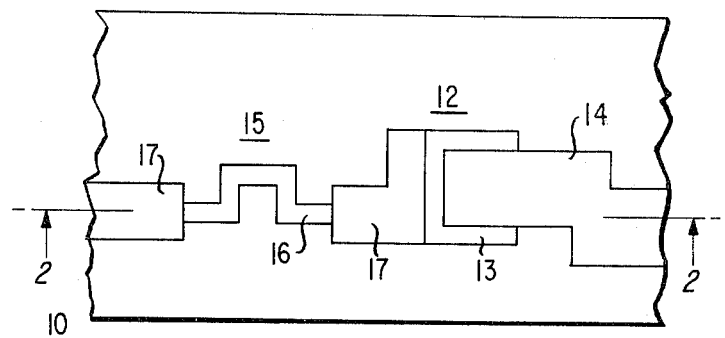
FIG. 1 is a top view of a portion of a circuit upon which the method of the present invention may be performed.

The invention is described, in accordance with one embodiment, with reference to the portion of a hybrid integrated circuit shown in plan view in FIG. 1 and in cross-section in FIGS. 2A–2D. It should be appreciated that this circuit is presented for illustrative purposes only. The inventive method would be used on circuits comprising many such elements, and could be used on any circuit requiring selective encapsulation.

The circuit elements, which are well known in the art, are formed on a substrate, 10, usually comprising ceramic. A layer of material, 11, which is usually tantalum, is deposited on the substrate and forms an electrode of capacitor 12. The dielectric of the capacitor is a layer, 13, of an oxide formed by anodizing a portion of the tantalum layer. The counter electrode is a metallization, 14, which can be a Cr-Pd-Au multilayer. The resistor, 15, is formed from a layer, 16, usually comprising tantalum nitride formed in the pattern as shown in FIG. 1. Interconnect metallization, 17, may be formed from a Ti-Pd-Au multilayer structure.

For purposes of this example, it is assumed desirable to keep resistor, 15, unencapsulated so that the resistance can be adjusted to take into account the electrical effects of encapsulation of the other elements. The process in accordance with one embodiment is therefore illustrated in FIGS. 2B–2D.

Figure 2A:
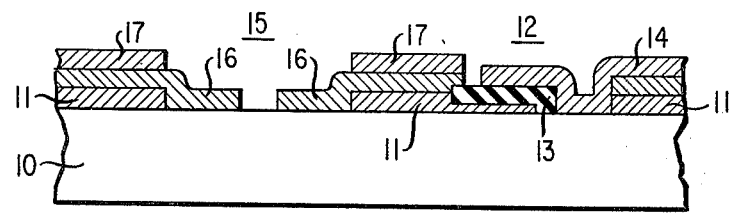
FIGS. 2A–2D are cross-sectional views of the circuit taken along line 2—2 of FIG. 1 during various stages of fabrication in accordance with one embodiment of the invention.
Figure 2B:
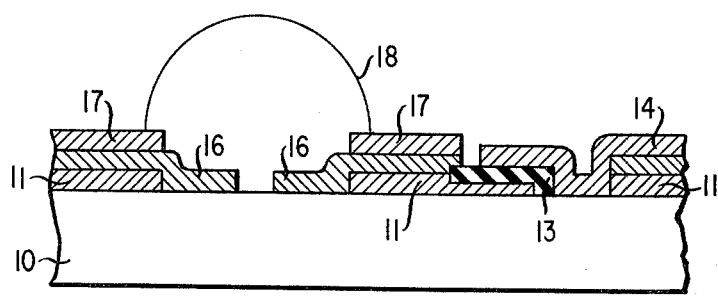

First, as shown in FIG. 2B, the area to remain unencapsulated was masked by depositing a droplet, 18, thereon comprising a polymer material which was inert to the organic solvent included in the encapsulant and soluble in a solvent, such as water or alcohol, which will not affect the encapsulant used. Initial experiments utilized a grease comprising mannitol-mannite and potato dextrin dissolved in a glycerin base. This material is manufactured by Fisher Scientific Co. and sold under the trademark NONAQ®stopcock grease. The material was deposited by means of a hypodermic syringe, and was sufficiently viscous to remain in the desired area. If the material is too viscous, glycerin or another suitable substance inert to organic solvents can be added. If the material is too fluid, it can be heated at approximately 50°–100° C to evaporate some of the liquid components. Thus, the viscosity can be adjusted for a particular need through simple experimentation by the skilled artisan. One of the advantages of the present method, therefore, is the fact that no additional masking which can affect the circuit components is needed.

Figure 2C:
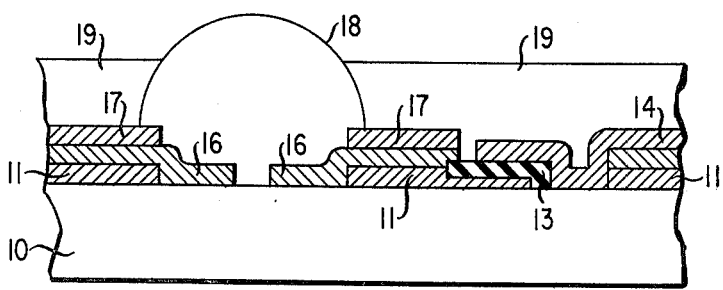

Next, as shown in FIG. 2C, an encapsulating material, 19, was deposited over the circuit. The particular encapsulant used was a room temperature vulcanizing (RTV) silicone rubber comprising a dimethyl siloxane long chain polymer with methoxy end groups dissolved in xylene in the proportion 33% by weight of polymer and 67% xylene. This encapsulant was sold by Dow Corning under the trade name 96-084 Dispersion. It will be appreciated that other similar encapsulants can be used in accordance with the invention. In general, the method should be compatible with any encapsulant which includes organic solvents such as the aromatics and chlorinated types. The encapsulant was deposited in accordance with standard flow coating techniques, which basically involve applying the material over the entire circuit from a dispenser under controlled pressure. Typically, the encapsulant has a dried thickness in the range 5-25 mils.

The present method is particularly compatible with flow coating since the mask forms a dome usually 30–50 mils high, over the protected areas. Preferably, the encapsulant is deposited on the unprotected areas of the circuit, and the encapsulant tends to flow around the dome resulting in complete coverage of the circuit without covering the mask as shown in FIG. 2C. If some encapsulant is deposited on the dome, it will tend to run off if the dome is sufficiently high. Even if the dome is not sufficiently high and some encapsulant remains thereon, it can easily be cut and peeled off by standard techniques.

Following encapsulant deposition, in accordance with this embodiment, the circuit was placed in a chamber which was evacuated to a pressure of 10–50 Torr for 60 seconds. This step is desirable to remove any air pockets which may exist under appliqued components such as beam lead devices or crossovers. It was found that the masking material was sufficiently viscous to maintain its mechanical integrity during the evacuation step and still provide good resolution.

Following evacuation, the encapsulant may be cured, either partially or completely, in accordance with standard techniques prior to removal of mask 18. That is, an RTV encapsulant is usually cured by keeping the circuit at room temperature and relative humidity between 30 and 60% for approximately 4 to 24 hours, followed by heating for 2–6 hours at 90–140° C.

In specific cases where the mask material may become less soluble due to the heat used to cure the encapsulant, it is preferable to remove the material after the first portion of the cure cycle. Such was the case in some instances for the material used in accordance with this embodiment. However, in accordance with further embodiments to be described, the mask 18 may be left on through the final cure.

Figure 2D:
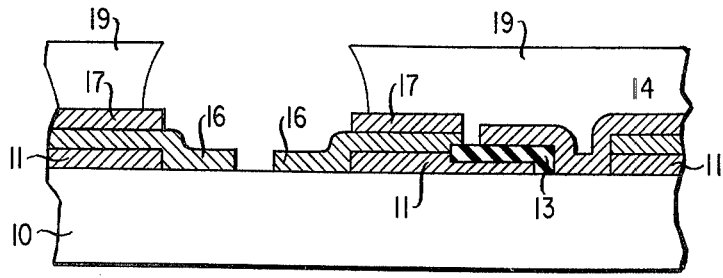

Following the hardening of the encapsulant, the mask 18 was easily removed by applying water which dissolved the mask and did not affect the encapsulant. Of course, other materials, such as alcohol, may be used as long as they do not affect the encapsulant. The resulting structure is illustrated in FIG. 2D.

It will be realized that many other materials will make suitable masks in accordance with the requirements of the invention. For example, a mixture of approximately 20 grams of polyvinylpyrrolidone and 13 grams of water was prepared and deposited on glass slides in the form of droplets with a thin rod of wood. Again, a room temperature vulcanizing rubber encapsulant comprising a dimethyl siloxane long chain polymer with methoxy end groups dissolved in xylene, in this case sold under the trade name DCQ 3-6550 Dispersion by Dow Corning, was flow coated on the slides. Prior to removal of the mask, the encapsulant on some slides was only partially cured by standing at room temperature and 45% relative humidity for approximately 23 hours and on some slides was cured completely by heating additionally at 120° C for 6 hours. the encapsulant was removed by dissolving with water. In the case of both sets of slides, the encapsulant was effectively defined only on the areas not covered by the mask, and practically no residue was observed on the masked areas. The same experiment was repeated with a masking material comprising approximately 17 grams of water and 10 grams of hydroxypropyl cellulose (sold under the trade name Klucel, Type L by Hercules, Inc.). Again, the encapsulant was successfully limited to the unmasked areas.

On the basis of these experiments, it is concluded that the masking material may comprise any water and/or alcohol soluble polymer which can be dissolved in sufficient quantity to deposit as a mechanically stable droplet and which is inert to organic solvents, such as xylene, used in the encapsulant. Examples of such materials include polyvinyl alcohol, polyethylene oxide, polyacrylic acid, carboxy methyl cellulose, or gelatin. Further, it appears that removal of the mask would be enhanced if glycerine is added in an amount of approximately 10–30% to keep the material wet.

Various additional modifications will become apparent to those skilled in the art. All such variations which basically rely on the teaching through which the invention has advanced the art are properly considered within the spirit and scope of the invention.

What is claimed is:

1. A method of selectively encapsulating a solid state integrated circuit formed on an insulating board comprising the steps of:

depositing on a selected area of the circuit a mask in the form of a stable droplet in a dome configuration with a height within the range 30–50 mils, said mask comprising a water soluble polymer which is inert to the organic solvents included in the encapsulant;

applying an encapsulating material comprising a room temperature vulcanizing silicone rubber dissolved in an organic solvent to said circuit by flow coating the material over the area of the circuit not covered by said mask;

curing said encapsulating material; and dissolving said polymer material by applying water thereto so as to expose the area of the circuit covered by said polymer and leave encapsulating material on the remaining area of the circuit.

2. The method according to claim 1 wherein the polymer material is selected from the group consisting of polyvinyl alcohol, polyvinylpyrrolidone, hydroxypropyl cellulose, polyethylene oxide, polyacrylic acid, carboxy methyl cellulose, and gelatin.

3. The method according to claim 1 wherein the encapsulating material comprises a dimethyl siloxane long chain polymer with methoxy end groups dissovled in xylene.

4. The method according to claim 1 wherein the polymer material comprises mannitol-mannite and potato dextrin dissolved in a glycerin base.

5. The method according to claim 1 wherein the encapsulating material is cured by keeping the circuit at room temperature and at a relative humidity between 30 and 60% followed by heating the circuit at a temperature in the range 90°–140° C for a period of time in the range 2–6 hours.

* * * * *